(12) United States Patent
Sheel et al.

(10) Patent No.: US 7,597,940 B2
(45) Date of Patent: Oct. 6, 2009

(54) METHODS FOR PREPARING TITANIA COATINGS BY PLASMA CVD AT ATMOSPHERIC PRESSURE

(75) Inventors: David William Sheel, Aughton (GB); Martyn Pemble, Ballinspittle (IE)

(73) Assignee: Saint-Gobain Glass France, Courbevoie (FR)

( * ) Notice: Subject to any disclaimer, the term of this patent is extended or adjusted under 35 U.S.C. 154(b) by 26 days.

(21) Appl. No.: 10/522,185

(22) PCT Filed: Jul. 30, 2003

(86) PCT No.: PCT/EP03/09314

§ 371 (c)(1), (2), (4) Date: Aug. 26, 2005

(87) PCT Pub. No.: WO2004/013376

PCT Pub. Date: Feb. 12, 2004

(65) Prior Publication Data

US 2006/0141290 A1 Jun. 29, 2006

(30) Foreign Application Priority Data

Jul. 30, 2002 (GB) .................................. 0217553.7

(51) Int. Cl.
*H05H 1/24* (2006.01)
(52) U.S. Cl. ...................... 427/570; 427/573; 427/576; 427/255.36
(58) Field of Classification Search ................ 427/569, 427/570, 576, 255.36, 573; 118/719
See application file for complete search history.

(56) References Cited

U.S. PATENT DOCUMENTS

| | | | | |
|---|---|---|---|---|
| 4,935,073 A | * | 6/1990 | Bartlett et al. | 148/247 |
| 5,156,882 A | * | 10/1992 | Rzad et al. | 427/489 |
| 5,185,132 A | * | 2/1993 | Horiike et al. | 422/186.05 |
| 5,295,220 A | | 3/1994 | Heming et al. | |
| 5,721,021 A | * | 2/1998 | Tobe et al. | 427/570 |
| 5,980,983 A | * | 11/1999 | Gordon | 427/226 |
| 5,993,916 A | | 11/1999 | Zhao et al. | |
| 6,110,544 A | * | 8/2000 | Yang et al. | 427/580 |
| 6,197,120 B1 | * | 3/2001 | David | 118/716 |
| 6,329,237 B1 | | 12/2001 | Kim et al. | |
| 6,338,738 B1 | * | 1/2002 | Bellotti et al. | 606/232 |
| 6,432,479 B2 | * | 8/2002 | Chang et al. | 427/255.394 |
| 6,828,235 B2 | * | 12/2004 | Takano | 438/680 |
| 2001/0025205 A1 | | 9/2001 | Chern et al. | |
| 2002/0086476 A1 | | 7/2002 | Kim et al. | |
| 2003/0072891 A1 | | 4/2003 | Murakami et al. | |
| 2005/0098115 A1 | * | 5/2005 | Barnes et al. | 118/719 |

FOREIGN PATENT DOCUMENTS

| | | | |
|---|---|---|---|
| JP | 8 253322 | | 10/1996 |
| JP | 2000 313962 | | 11/2000 |
| WO | WO 98/06675 | * | 2/1998 |
| WO | 02 48428 | | 6/2002 |

OTHER PUBLICATIONS

Haenni, W. et al., "Titania-Coatings on Strongly Passivated Substrates". Journal De Physique, Colloque C5, supplement au n5, Tome 50, May 1989, pp. 401-409.*
Piwonski, Ireneusz, et al., "Vapor Phase Modification of Sol-Gel Derived Titania Surfaces". Applied Surface Science 253 (2006) pp. 2835-2840.*
O'Neill, Shane A. et al., "Atmospheric Pressure Chemical Vapour Deposition of Titanium Dioxide Coatings on Glass". Journal of Materials Chemistry 2003, 13, pp. 56-60.*
Imai, Hiroaki, et al., "Alternative modification methods for sol-gel coatings of silica, titania and silica-titania using ultraviolet irradiation and water vapor." Thin Solid Films, 351 (1999) pp. 91-94.*
Sirghi, L., et al., "Photocatalytic chemisorption of water on titanium dioxide thin films obtained by radio frequency magnetron deposition". Applied Surface Science 244 (2005) pp. 408-411.*
Lee, Kee-Sun, et al., "Anatase-phase titanium oxide by low temperature oxidation of metallic Ti thin film". Scripta Materialia 48 (2003) pp. 659-663.*
Kajihara, Koichi, et al., "Macroporous Morphology of the Titania Films Prepared by a Sol-Gel Dip-Coating Method . . ." Journal of Sol-Gel Science and Technology 19, pp. 219-222, 2000.*

* cited by examiner

*Primary Examiner*—Bret Chen
(74) *Attorney, Agent, or Firm*—Oblon, Spivak, McClelland, Maier & Neustadt, L.L.P.

(57) ABSTRACT

A method for deposition of titania, and titania-containing, thin films by CVD, using an atmospheric pressure glow discharge plasma as a major source of reaction, which leads to film properties, and film growth rates, normally only achievable (by atmospheric pressure CVD) with significantly higher substrate temperatures.

20 Claims, No Drawings

METHODS FOR PREPARING TITANIA COATINGS BY PLASMA CVD AT ATMOSPHERIC PRESSURE

CROSS-REFERENCE RELATED APPLICATIONS

The present application is the U.S. counterpart of WO 2004/013376 and claims priority to UK Application No. 0217553.7 filed on Jul. 20, 2002, the entire contents of each of which are hereby incorporated herein by reference.

INTRODUCTION

Titania is a widely used material in thin film coatings. It has been used, for example, as a hard coating and as a transparent dielectric materials in optical stacks. In recent years the photo-catalytic properties of titania have attracted increasing interest. (e.g Paz & Luo, J. Mat. Res Vol 10, no 11, November 1995). Titania layers have been deposited by many techniques (e.g. evaporation, e-beam, sputtering, sol gel, and CVD).

Chemical Vapour Deposition (CVD) has been widely used for many years across a wide range of industrial applications, to produce thin film coatings. In such a process a reactive gas mixture is introduced in the coating region, and a source of energy applied to initiate (or accelerate) a chemical reaction, resulting in the growth of a coating on the target substrate.

Energy sources (for CVD) are normally thermal or plasma, however other sources (such as laser, arc, UV etc) have been employed in special application areas. The choice of thermal or plasma activation is determined by a number of factors—such as film properties required, growth rates, process integration issues, economic considerations etc. However, one primary decision factor is often the operating temperature as defined by the maximum temperature allowed for the chosen substrate. Atmospheric pressure CVD (APCVD) has established itself increasingly in recent years, as a technologically and commercially attractive sub set of CVD coating. It has been particularly successfully employed in high throughput continuous or semi-continuous coating processes. The APCVD approach has also found application in smaller volume processes where its lower overall costs can be decisive. Furthermore, although in many cases the film properties of CVD coatings across many of the deposition activation approaches are broadly similar, there are in certain cases important differences leading to potentially further "differentiated" characteristics of the processes approach. Such combinations of advantages has lead to AP thermal CVD being used in a wide range of industrial applications such a on-line glass coating, tool coating, ion barrier layer deposition, anti-corrosion and adhesion layers on metals, scratch coatings on bottles etc. An example of AP thermal CVD applied to a continuous process is described in patent no WO 00/705087.

As mentioned above, a major limitation to application scope of thermal APCVD has, to date, been the substrate temperature required to achieve target growth rates and target thin film properties. Typically for AP thermal CVD these can be over 500° C. and can reach over 1000° C. in some applications. A few (APCVD) applications are known which use temperatures below 500° C. for example in the growth of certain II-VI materials by metal organic CVD, however they are generally limited in scope of application, and apart from the one cited above, tend to produce films with properties sufficient for purpose but not optimised (due to the low temperature requirements). Typically in situations where CVD is the preferred approach but where substrate temperatures are limited to below 500° C. and can sometimes be required to be below 100° C., then a plasma approach is often selected. This need for reduced substrate temperatures is also manifested in systems where diffusion processes, which are enhanced at higher temperatures, leads to degradation of the material or device. However, to date such plasmas, used in industrial CVD coating applications, have been based on a vacuum approach.

Such a vacuum approach, although capable of achieving target lower substrate temperatures has major technological limitations for certain applications. The vacuum systems are typically of significant capital cost, and can result in lower growth rates (than APCVD) due to the lower reactive species concentrations in a vacuum. Additionally, vacuum based processes are more difficult to integrate into a high throughput process e.g. requiring complex and expensive handling (e.g. load-lock) approaches between substrate introduction (from open air) into the vacuum system. For continuous strips, films, or sheets this can be a major limitation, and although some solutions have been proposed (based on differential pumping) this is rarely applied due to cost and complexity.

BACKGROUND OF THE INVENTION

The described invention addresses the low temperature deposition of titania and also, optionally, a process designed to achieve/retain a degree of photo-catalytic activity. This process seeks to, in part, bridge the significant technological "gap" between current AP thermal CVD and vacuum plasma CVD for the deposition. The invention describes a route to achieving the low substrate temperatures associated with plasma CVD, whilst avoiding the cost and process design constraints of a vacuum system. The invention also allows for much faster titania growth rates to be achieved, than normally possible with vacuum plasma CVD.

Although atmospheric pressure glow discharge plasmas (APGDP) have been known for some time, the application of such plasmas has been largely limited to surface treatment e.g. pre-treatment of plastics prior to printing or second stage coating.

In recent years a number of literature reports, and more recently patents, have covered the area of APGDP, their generation, and applications. Patents such as (U.S. Pat. Nos. 5,938,854 and 6,221,268) discuss application to surface treatment. A small number of literature reports cover the issue of using APGD plasmas for producing coatings on a surface. Primarily these are considering deposition of "plasma polymerised" films i.e. films which have a significant organic content or show characteristics which would not normally be considered as inorganic. (e.g. Goosens, Dekempeneer et al, Surface and Coatings Techn, 2001, and DE 19955880). A few patents deal with deposition of inorganic type films (e.g. U.S. Pat. No. 6,235,647) however the materials considered, and the approaches suggested are not optimised for industrial exploitation. To date no industrial application of APGDP activated CVD is known to us. We are also not aware of any reports of titania deposition via a APGD (Atmospheric Pressure Glow Discharge) CVD (Chemical Vapor Deposition) approach.

The invention described herein addresses these limitations, and defines a process or a method particularly compatible with the establishment of an industrially viable process for the deposition of functional titania coatings.

According to the invention, the method for depositing titania, or titania-containing as thin films on a substrate, the method comprising the steps of:

using an atmospheric pressure glow discharge plasma as a major source of reaction to improve film properties and film growth rates, heating the substrate at a temperature below 250° C., preferably below 100° C., a reactive titania CVD precursor is introduced into a gas flowing through a coating region which has been pre-vaporised into the introduced gas flow.

The method particularly addresses the need for high titania growth rates at lower temperatures than normally employed in APCVD processes. The process also identifies the importance of controlling plasma conditions and gas phase concentrations, to achieve target compositional, physical and functional properties.

In order to achieve target low temperature operation and target process characteristics the plasma type and operation details needs to be carefully selected. Many different types of plasmas exist, however a glow discharge plasma is particularly advantageous as it can be operated as a non-thermal plasma. A range of power sources and settings can generate such plasmas, however we have found that the use of low frequency AC plasmas give appropriate performance.

In such a case, where an appropriate plasma is used, the thermal temperature of the plasma is much lower than the electronic temperature. The preferred frequency range for this type of plasma at atmospheric pressure, is different from that normally used for vacuum plasma generation. This can be understood in terms of the generation and trapping of sufficient plasma species, within the plasma-coating zone, which will be moderated by the much higher gas molecule densities at AP. For example, diffusion rates, active species lifetimes and charge build up will all differ markedly with increased pressure operation. The frequency range below 100 KHz is typically proposed, and a number of reports use frequencies around 20 KHz or below. The optimum frequency will depend a number of factors including; reactor design, materials used, plasma gases chosen, additive concentrations, voltage and power levels employed.

The gases employed to support the GD plasma are normally selected from helium, argon and nitrogen (or mixtures thereof) although it is possible to introduce additional gases as minority components to achieve particular plasma characteristics (e.g. oxidising properties).

To achieve good quality optical and mechanical properties in the films of titania grown using this approach, and also to achieve photo-active titania, we have found it necessary to carefully control the plasma and chemical reactions occurring. An example of this is with water vapour levels in the reaction chamber to avoid unwanted reactions. Careful control of the oxidising source (typically oxygen gas but alternative oxygen containing species can be used e.g. organic oxygen containing species) is necessary to achieve optimum performance in terms of film properties.

MAIN INNOVATIVE ASPECTS

The use of an APGD plasma CVD approach for depositing inorganic films is an innovative approach. Achieving good film quality and a viable process is novel. Furthermore, to our knowledge no deposition of titania via a APGD plasma CVD approach has been reported previously. No industrial exploitation of such a process is known. Achieving very high growth rates of good quality films is a major innovative step.

Furthermore, achievement of photo-catalytic film properties via APGD plasma CVD is novel and potentially of significant commercial interest.

Achieving deposition of titania onto plastic films and substrates is a major step forward in opening up commercial opportunities.

To achieve these properties we define a process in which the gas flow through the reaction zone is as close to laminar flow as can be achieved. This requires that a distributor be employed for the introduction of gases and, preferably, that a further distributor be employed in the extraction region. Furthermore it is necessary that all the reactive gases, to be introduced, are premixed prior to introduction into the reaction zone. It is necessary to choose the plasma type, power, frequency and plasma gas(es) appropriately. We have employed a power supply frequency of 10-25 KHz, power levels from less than 1 to around 10 watts per $cm^{2.}$ The plasma gases applied have been helium, argon and nitrogen. Helium gives the most stable and flexible configured plasma systems and, generally, the best film quality, however, other gases can be successfully used if design constraints and film property targets are flexible enough. Reactive precursors and oxidising gases have also to be carefully selected for optimum performance. In our work of titania growth, we have employed titanium tetrachloride and alkoxides of titania.

Careful control of the plasma conditions and gaseous composition, during film growth, can be important in achieving a degree control of stoichiometric control of the layer composition highly advantageous in achieving desired functional film properties. Achieving this is a balance of having sufficient reaction (e.g. plasma energy, time, oxidation sources, reactive species concentrations etc) to achieve desired chemical and structural properties, whilst avoiding undesirable reactions (e.g. pre-reaction, and enhanced homogeneous reactions)

In our work, the inventors are observed that in order to achieve maximised physical and photo-catalytic properties a post film growth treatment in an APGD plasma produces controllable changes in properties, which are very beneficial. Such changes are believed to be due to bombardment of the grown film with reactive plasma species, which densify, and further react chemically with the film. Surprisingly, we have observed—under certain conditions—a degree of crystallinity or an increase in the degree of crystallinity of the films during this post treatment stage, which is not only helpful for physical properties (adhesion, hardness, scratch resistance, etc) but has a significant impact on photo-catalytic properties. The post treatment stage can be performed in-situ (e.g. by shutting of precursor flow and maintaining a plasma—possibly of different characteristics than that used for growth ). It should be noted that films produced by this approach are, however, photo-active even when not showing measurable crystallinity.

APPLICATIONS

Whilst not wishing to limit the scope, we illustrate the potential of the invention by example.

For coating continuous substrates which move under or through the coating region and where coating at a temperature below that normally applied in thermal CVD is advantageous and atmospheric pressure operation is desired. This can include coating of plastic film, plastic components, continuous or semi-continuous sheets (e.g. of glass, metal, or plastic like window profiles) and fibres.

EXPERIMENTAL EXAMPLES

The examples below are meant to illustrate scope, and potential, and are not in themselves meant to be limiting.

Typical Experimental Conditions Applied:
Frequency: 10-25 KHz (variable)
Power: 100 W to 1 KW.
Configuration: parallel plates with either one or both surfaces covered by an dielectric barrier (e.g. glass, ceramic or plastic film or sheet).
Electrode gap (as measured from the internal surface whether it be the metal electrode or the dielectric) of varied between approx 1 and 15 mm. Optimum region was between 2 and 6 mm.
Power densities: 0.1-10 Watts $cm^2$ (generally 0.5-2 watts $cm^2$)
Carrier (i.e. plasma) gas-helium
Carrier Gas temperature (delivered)—ambient to approx 50° C. (to ensure precursor volatility)
Plasma gas temperature approx 50-100° C. (measured by contact probe)
Carrier Gas flow rate 1-2 liters min
Titania precursor pre-volatilised (e.g. in a bubbler) and delivered at conc. ranges below 1% and most often in the region of O 0.1%.
Oxygen level less than 1% and typically less than 0.1%

Photo-catalytic Activity Measurement

The activity of the films produced has been measured using a series of techniques including stearic acid removal rate, optical scattering reduction, and surface energy measurements. The most commonly applied technique in the literature is stearic acid removal and the experimental procedures are described in a paper by Heller and Paz, J Mat Res vol. 12, no 10, October 1997. In summary, a stearic acid film is deposited on the coating to be tested, and under selected UV irradiation, the reduction in the area of a selected IR peak of stearic acid is monitored as it progressively reduces. In our work we use an FTIR spectrometer to measure this peak.

Analysis Instrumentation

Scanning electron microscopy (SEM) images were obtained using a Philips XL30 with Phoenix energy dispersive analysis of X-rays (EDAX) spectrometer. X-ray photoelectron spectra (XPS) were recorded on Kratos Axis 165 or Amicus spectrometers while X-ray diffraction (XRD) data was recorded on a Philips PW1130 diffractometer. Rutherford backscattering (RBS) measurements were made using a 2 MeV accelerator and $He^+$ analysing beam at normal incidence and scattering angle of 168° in IBM geometry. The RBS data were compared with simulation data from a model using the Quark software package.

Experiment Example 1

Demonstration of Growth Rate Achievable

A film of titania was grown from titanium tetrachloride (0.1%) and oxygen (0.1%) in a helium carrier gas. The substrate used was glass. Both uncoated glass and glass which was pre-coated with a blocking silica layer were used. The plasma was initiated in nominally 100% helium, and the premixed reactive gas mixture then introduced. Total gas flow was approx 2 liters per min. Power level was 100 Watts over an area of approx 150 $cm^2$. The configuration was parallel plate with a gap of 4 mm and both electrodes covered by a glass dielectric of 2 mm thickness. Introduction gas temperature was ambient.

The film was grown over 10 seconds. Gas outlet temperature was approx 80° C. The film grew to a thickness equivalent to growth rate in excess of 100 nm per second. The film was measured for photo-activity and found to be photo-catalytically active to stearic acid and contact angle effects. The activity rate (measured spectroscopically by MIR peak area reduction) was estimated at $2.5 \times 10^{-2}$ $cm^{-1}$ $min^{-1}$ for a film thickness of approx 100 nm. The activity level varied with thickness, (as has been reported in the literature), and significantly higher activity levels of activity were recorded with increased film thickness.

Experiment 2

Demonstration of Optical Properties

The films produced in example 1 were visually transparent. They were measured on an UV/Vis spectrometer and were found to have high transmission levels across the visible region. Transmission varied with thickness as predicted from reflection related interference effects. Reflection levels from around 12% up to 20% were the film was thickest. Absorption levels were low typically from a few % to less than 1.

Experiment Example 3

Demonstration of Effect of Post Treatment on Properties

Two films were produced, one as per example 1 and a second produced as per example 1 but then "post treated" by retaining it in the GD plasma for 60 secs. after coating had finished. The resultant films differed notably in properties. The post-treated films were much more adherent and durable (e.g. by cross hatch and water soak resistance tests).

Experiment Example 4

Demonstration of Potential to Coat Plastics

The conditions applied to example 1 were then used to coat plastic substrates. Plastics chosen included Perspex, PET and polypropylene. In each case the plastic substrate was pretreated with the plasma for approx 20 seconds. This pretreatment was found to enhance adhesion. The films grew similarly to those on glass, and were also found to be photo-active. The films were adherent (to cross hatch) and resistant to abrasion simulation.

Experiment 5

Use of Alternative Plasma Gases

The system used in example 1 was tested for use with alternative (to helium) plasma gases. Argon and nitrogen were used as examples. Argon was the better of the two. The alternative gases could produce a GD plasma but better quality discharges were seen with reduced electrode gaps and thinner dielectrics.

Experiment Example 6

Effect of Oxygen Level

The conditions from example 1 were re-run with varying levels of oxygen. Oxygen was set at 1%, 0.1% and 0.025%.

The experiments were repeated on both glass and plastic substrates. At 1% oxygen the film grew rapidly but with a degree of hazy and pre-reaction which was detrimental to the optical properties of the film produced. At 0.1% the growth rate was comparably high, and the pre-reaction was reduced significantly. Toward the back end of the reactor some more hazy film was noted. If the total gas flow was increased (e.g. to double) this was significantly reduced but at the expense of reduced growth rate and precursor efficiency. At 0.25% the growth rate was reduced by approx 25-50% but the films were of high quality optically and had good adhesion (cross hatch test and after water soaking for 2 hours)

The results on glass and plastic showed similar trends.

Experiment Example 7

Effect of Background Water

Helium was introduced into the reactor with levels of humidity deliberately set at approx 1% and at 0.05%. At the higher level the plasma was unstable and of reduced quality as determined by a visual inspection of the plasma region. No film growth was attempted. At the lower level a significant degree of gaseous pre-reaction was observed. The resultant film was hazy and of reduced adhesion. When the humidity levels were returned to example 1 conditions (i.e. some tens of ppm) the films returned to good quality.

Experiment Example 6

Use of Alternative Precursor

As an example of an alternative precursor (to titanium tetrachloride) titanium tetraisopropoxide was tested. The conditions of example 1 were employed except that no oxygen was used as the precursor contains sufficient oxygen for reaction. The precursor concentration were set at the same level as titanium tetrachloride in example again a titania film grew quickly and of good quality.

Whilst not wishing to limit the scope of the invention, the flowing descriptions set forth various preferred configurations and features of the invention.

The thin film is deposited on preformed and/or thermally toughened substrates. The thin film is deposited with a uniformity of at least +/−20%, preferably a uniformity of at least +/−10%, and more preferably a uniformity of at least +/−5%. A power density of the plasma is below 5 $Wcm^{-2}$, preferably below 1 $Wcm^{-2}$, and more preferably below 0.5 $Wcm^{-2}$. A peak growth rate is at least 10 nm per second, preferably several tens of nm per second, and most preferably over 100 nm per second. A level of water and oxygen can be controlled to achieve target growth rates and to control unwanted side reactions, the oxygen level being below 5% and more preferably below 1%, and the water vapour levels being controlled preferably below 1% and more preferably below 0.1%.

The glow discharge plasma is preferably generated, between electrodes, by a low frequency source in which the frequency is below 100 KHz and preferably below 30 KHz. The electrodes are preferably selected from a material that reduces heat generation. The electrodes are made of metal, and preferably brass.

The invention can include a thermal control system in the coating region to maintain the substrate temperature at a desired level, wherein the thermal control system utilizes gas coolant, water coolant, liquid coolant, or combinations thereof. The thermal control system is configured to cool the coating region to reduce unwanted side reactions.

The invention can also include one or more gas flushing zones to allow introduction and removal of the substrate from the coating region while maintaining integrity of the gas composition in the coating region.

As is evident from the above disclosure, the present invention can advantageously be used for depositing the thin film on a moving substrate of a continuous film or sheet, or a series of substrates supplied semi-continuously. The present invention can also be used for depositing a thick film or layers of different composition on a substrate by arranging sequential coating regions along a direction of movement of the substrate. Also, the method of the present invention coating can be used in combination with a different depositing method.

The invention claimed is:

1. A method for depositing a thin film on a substrate, the method comprising:
   heating the substrate at a temperature below 250° C.;
   introducing a pre-vaporized reactive titania CVD precursor into a gas flow flowing through a coating region;
   applying energy to generate an atmospheric pressure glow discharge plasma in the coating region and using the atmospheric pressure glow discharge plasma as a major source of reaction to deposit the thin film on the substrate heated at the temperature below 250° C.; and
   performing a post treatment on the thin film using an atmospheric glow discharge plasma to modify properties and structure of the thin film;
   wherein a water vapor level is controlled to be from 0.05% to 1%.

2. A method according to claim 1, wherein the post treatment modifies the stoichiometry of the thin film allowing control of film properties.

3. A method according to claim 1, wherein the gas flow flowing into and through the coating region is a laminar flow.

4. A method according to claim 1, further comprising providing an extraction system to control gas flow through the coating region which supports controlled flow.

5. A method according to claim 1, further comprising providing a thermal control system in the coating region to maintain the substrate temperature at a desired level, wherein said thermal control system utilizes gas coolant, water coolant, liquid coolant, or combinations thereof.

6. A method according to claim 5, wherein the thermal control system is configured to cool the coating region to reduce unwanted side reactions.

7. A method according to claim 1, wherein the reactive titania CVD precursor which is introduced in the coating region is an alkoxide of titanium or titanium tetrachloride.

8. A method according to claim 1, wherein the thin film is deposited with a uniformity of at least +/−5%.

9. A method for depositing a thick film or layers of different composition on a substrate using the method according to claim 1 by arranging sequential coating regions along a direction of movement of the substrate.

10. A method of coating a substrate using the method according to claim 1 in combination with a different depositing method.

11. A method according to claim 1, wherein the glow discharge plasma is generated, between electrodes, by a low frequency source in which the frequency is 30 KHz.

12. A method according to claim 11, wherein the electrodes are selected from a material that reduces heat generation.

13. A method according to claim 11, wherein the electrodes are made of brass.

14. A method according to claim 1, wherein power density of the plasma is below 0.5 Wcm$^{-2}$.

15. A method according to claim 1, wherein a peak growth rate of the thin film on the substrate is over 100 nm per second.

16. A method according to claim 1, wherein the thin film is deposited on preformed and/or thermally toughened substrates.

17. A method according to claim 1, wherein the thin film is deposited on temperature sensitive substrates including thermally preformed substrates and plastic substrate materials.

18. A method according to claim 1, wherein a level of water and oxygen are controlled to achieve target growth rates and to control unwanted side reactions, the oxygen level being below 1%, the water vapour levels being controlled below 0.1%.

19. A method according to claim 18, wherein the substrate upon which the thin film is deposited on is a single moving substrate of a continuous film or sheet, or a series of separate moving substrates.

20. A method according to claim 1, further comprising providing one or more gas flushing zones to allow introduction and removal of the substrate from the coating region while maintaining integrity of the gas composition in the coating region.

* * * * *